(12) United States Patent
Meldrim

(10) Patent No.: US 8,093,129 B2
(45) Date of Patent: Jan. 10, 2012

(54) METHODS OF FORMING MEMORY CELLS

(75) Inventor: John Mark Meldrim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 444 days.

(21) Appl. No.: 12/365,037

(22) Filed: Feb. 3, 2009

(65) Prior Publication Data

US 2010/0197095 A1 Aug. 5, 2010

(51) Int. Cl.
*H01L 21/28* (2006.01)
*H01L 29/792* (2006.01)

(52) U.S. Cl. ........... 438/288; 438/216

(58) Field of Classification Search ............... None
See application file for complete search history.

(56) References Cited

U.S. PATENT DOCUMENTS

| | | | |
|---|---|---|---|
| 5,958,155 A | 9/1999 | Kawamata et al. | |
| 6,413,819 B1 * | 7/2002 | Zafar et al. | 438/257 |
| 7,105,428 B2 | 9/2006 | Pan et al. | |
| 7,128,986 B2 | 10/2006 | Lamberton et al. | |
| 7,211,439 B2 | 5/2007 | Vossmeyer et al. | |
| 7,221,017 B2 | 5/2007 | Forbes et al. | |
| 7,355,238 B2 | 4/2008 | Takata et al. | |
| 7,550,802 B2 * | 6/2009 | Koyanagi et al. | 257/324 |
| 7,759,715 B2 | 7/2010 | Bhattacharyya | |
| 2005/0122775 A1 | 6/2005 | Koyanagi et al. | |
| 2006/0252202 A1 * | 11/2006 | Dai et al. | 438/257 |
| 2007/0046164 A1 | 3/2007 | Subramanian | |
| 2007/0108502 A1 | 5/2007 | Li et al. | |
| 2007/0202648 A1 | 8/2007 | Choi et al. | |
| 2008/0182428 A1 * | 7/2008 | Merchant et al. | 438/787 |
| 2009/0097320 A1 | 4/2009 | Min et al. | |
| 2010/0068505 A1 * | 3/2010 | Hartmut et al. | 428/328 |

FOREIGN PATENT DOCUMENTS

WO PCTUS2010020526 8/2010

OTHER PUBLICATIONS

Dhara, S., "Formation Dynamics, and Characterization of Nanostructures by Ion Beam Irradiation", Jun. 16, 2007, 20 pages, Red Orbit Breaking News www.redorbit.com/.../index.html?source=r_science—92k.
Xu, Yinfan, et al., "Cluster-Assembled Nanocomposites", 2006, 18 pages, University of Nebraska, Research Papers in Physics and Astronomy, David Sellmyer Publications.
J. Antony et al., "ZnO nanoclusters: Synthesis and photoluminescence", Applied Physics Letters 87, Dec. 7, 2005, pp. 241917-1 through 241917-3.
J. M. Meldrim et al., "Magnetic properties of cluster-beam-synthesized cobalt: Noble-metal films", Journal of Applied Physics, vol. 87, No. 9, May 1, 2000, pp. 7013-7015.

* cited by examiner

*Primary Examiner* — Zandra Smith
*Assistant Examiner* — Pamela E Perkins
(74) *Attorney, Agent, or Firm* — Wells St. John P.S.

(57) ABSTRACT

Some embodiments include methods of forming memory cells. A semiconductor construction may be provided, with such construction including tunnel dielectric material over a semiconductor substrate. The construction may be placed within a chamber. While the construction is within the chamber, a plurality of charge-trapping centers may be dispersed over the tunnel dielectric material. The charge-trapping centers may be nanoclusters formed by sputter-depositing metallic nanoparticles into an aggregation chamber, and then aggregating groups of the nanoparticles into the nanoclusters. Also while the construction is within the chamber, electrically insulative material may be formed over and between the charge-trapping centers. Control gate material may then be formed over the electrically insulative material.

16 Claims, 14 Drawing Sheets

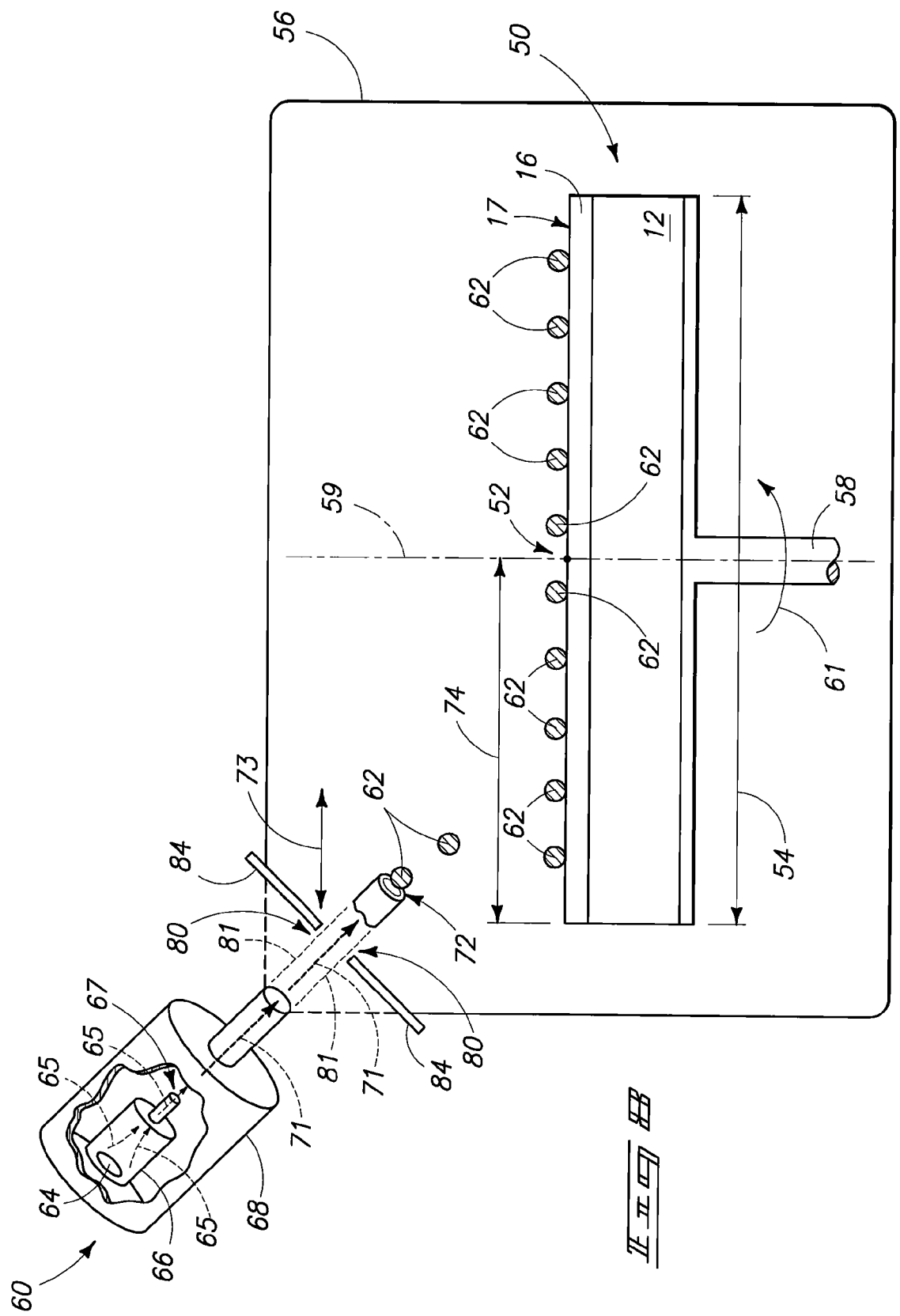

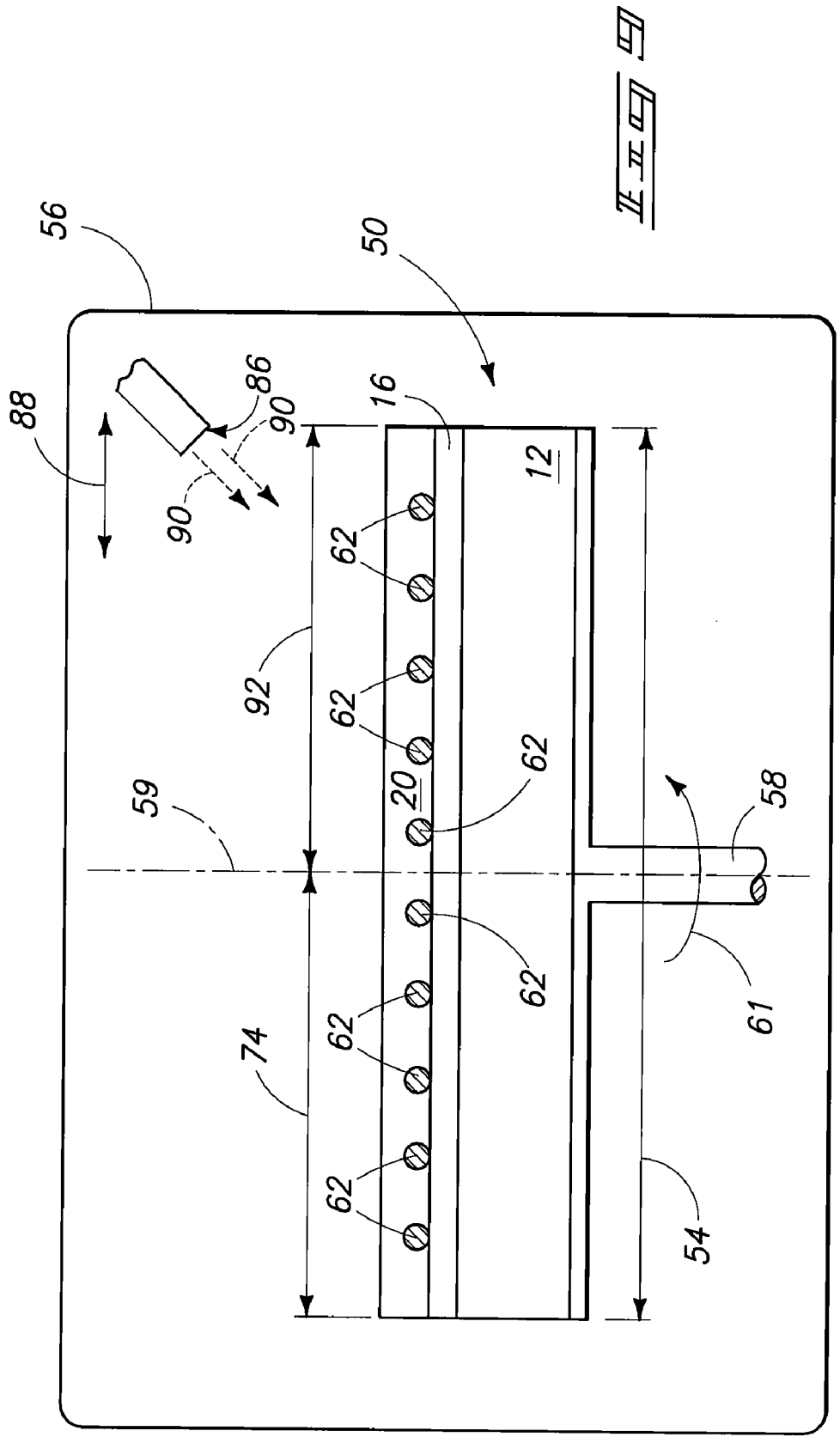

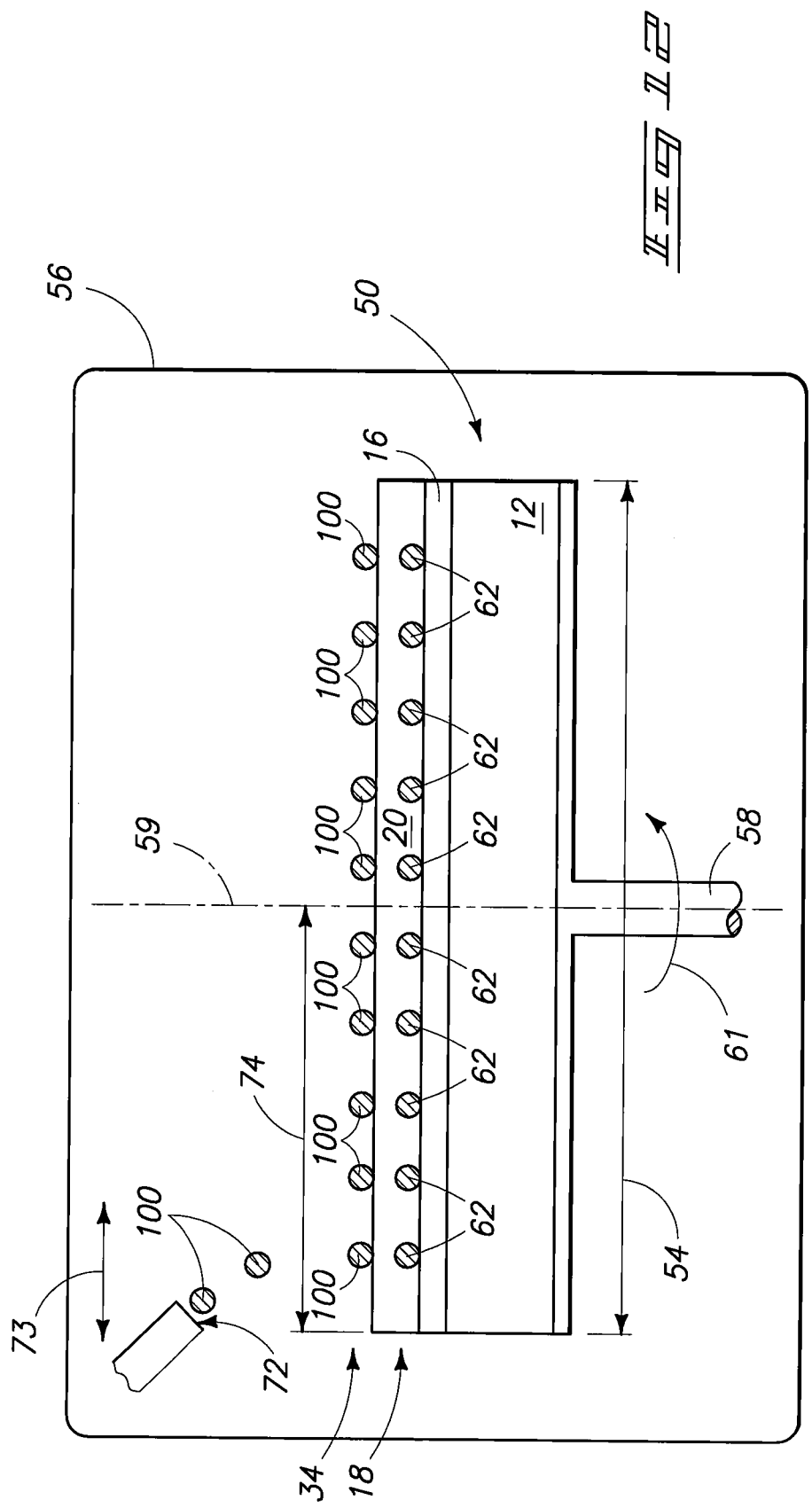

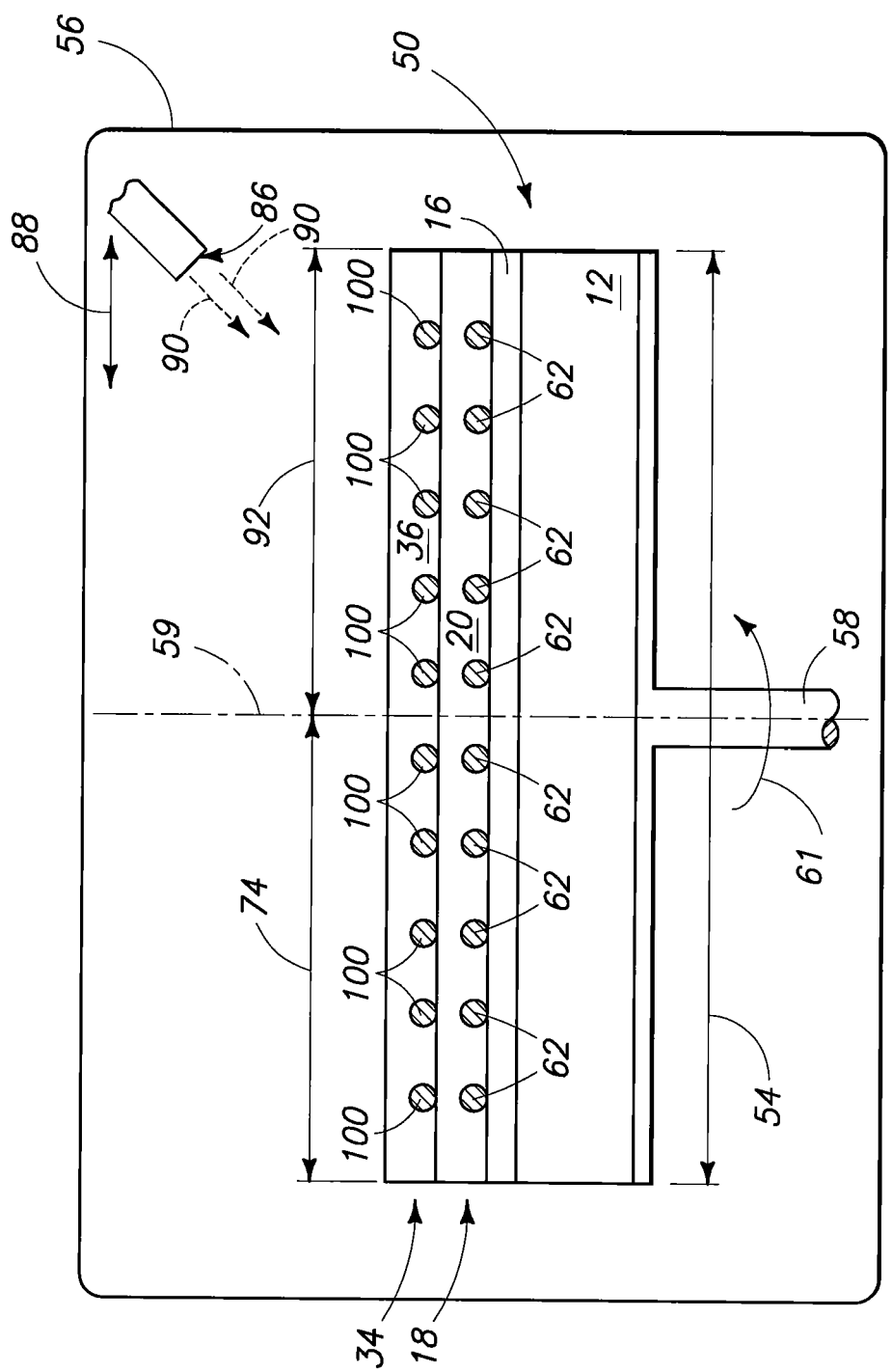

METHODS OF FORMING MEMORY CELLS

TECHNICAL FIELD

Methods of forming memory cells, such as NAND unit cells.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such BIOS is sometimes called flash BIOS. Flash memory is also popular in wireless electronic devices because it enables the manufacturer to support new communication protocols as they become standardized, and to provide the ability to remotely upgrade the device for enhanced features.

A typical flash memory comprises a memory array that includes a large number of non-volatile memory cells arranged in row and column fashion. The cells are usually grouped into blocks. Each of the cells within a block may be electrically programmed by charging a floating gate. The charge may be removed from the floating gate by a block erase operation. Data is stored in a cell as charge in the floating gate.

NAND is a basic architecture of flash memory. A NAND cell unit comprises at least one select gate coupled in series to a serial combination of memory cells (with the serial combination being commonly referred to as a NAND string). The gates of the NAND string have traditionally been single level cells (SLCs), but manufacturers are transitioning to utilization of multilevel cells (MLCs) for gates of NAND strings. An SLC stores only one data bit, whereas an MLC stores multiple data bits. Accordingly, memory array density can be at least doubled by transitioning from SLCs to MLCs.

MLCs differ from SLCs in the programming of the devices. Specifically, a device may be programmed as an SLC if the device is programmed to have only two memory states (0 or 1), with one of the memory states corresponding to one level of stored charge at a floating gate (for example, corresponding to the fully charged device) and the other corresponding to another level of stored charge at the floating gate (for example, corresponding to the fully discharged device). Alternatively, the device may be programmed as an MLC having two bits of memory if the device is programmed to have four memory states. The memory states may be designated as the 11, 01, 00, and 10 memory states, in order from lowest stored charge (for example, fully discharged) to highest stored charge (for example, fully charged). Accordingly, the 11 state corresponds to a lowest stored charge state, the 10 state corresponds to a highest stored charge state, and the 01 and 00 states correspond to, for example, first and second intermediate levels of stored charge.

Regardless of whether devices are utilized as MLCs or SLCs, there are continuing goals to avoid parasitic capacitive coupling effects and stress-induced gate leakage, and to have a large memory window (with a memory window being the charge window that enables a non-volatile cell to be charged, and being defined by how much charge is placed on the cell within a given time). A large memory window may enable the multiple memory states of an MLC device to be clearly separated from one another.

Charge-trapping materials, such as, for example, metallic charge traps (MCTs) show promise for utilization in non-volatile memory cells, but difficulties are presented in obtaining large memory windows, good retention of charge by non-volatile devices, and uniformity across numerous devices of a NAND array (in other words, avoiding cell-to-cell sigma variation).

It is desired to develop structures and fabrication processes by which to alleviate or overcome one or more of the above-discussed difficulties and/or to achieve one or more of the above-discussed goals.

BRIEF DESCRIPTION OF THE DRAWINGS

FIGS. 8 and 9 show the semiconductor construction of FIG. 7 within an example apparatus and being processed in accordance with an example embodiment. FIGS. 8 and 9 illustrate different processing stages, with the processing stage of FIG. 9 being subsequent to that of FIG. 8.

FIGS. 10 and 11 show the semiconductor construction of FIG. 9 being processed in accordance with an example embodiment. FIGS. 10 and 11 illustrate different processing stages, with the processing stage of FIG. 11 being subsequent to that of FIG. 10.

FIGS. 12 and 13 show the semiconductor construction of FIG. 9 within an example apparatus and being processed in accordance with another example embodiment. FIGS. 12 and 13 illustrate different processing stages, with the processing stage of FIG. 12 following that of FIG. 9, and with the processing stage of FIG. 13 being subsequent to that of FIG. 12.

FIGS. 14 and 15 illustrate different processing stages, with the processing stage of FIG. 15 being subsequent to that of FIG. 14.

FIGS. 17-19 illustrate different sequential processing stages.

DETAILED DESCRIPTION OF THE ILLUSTRATED EMBODIMENTS

Figure 1:
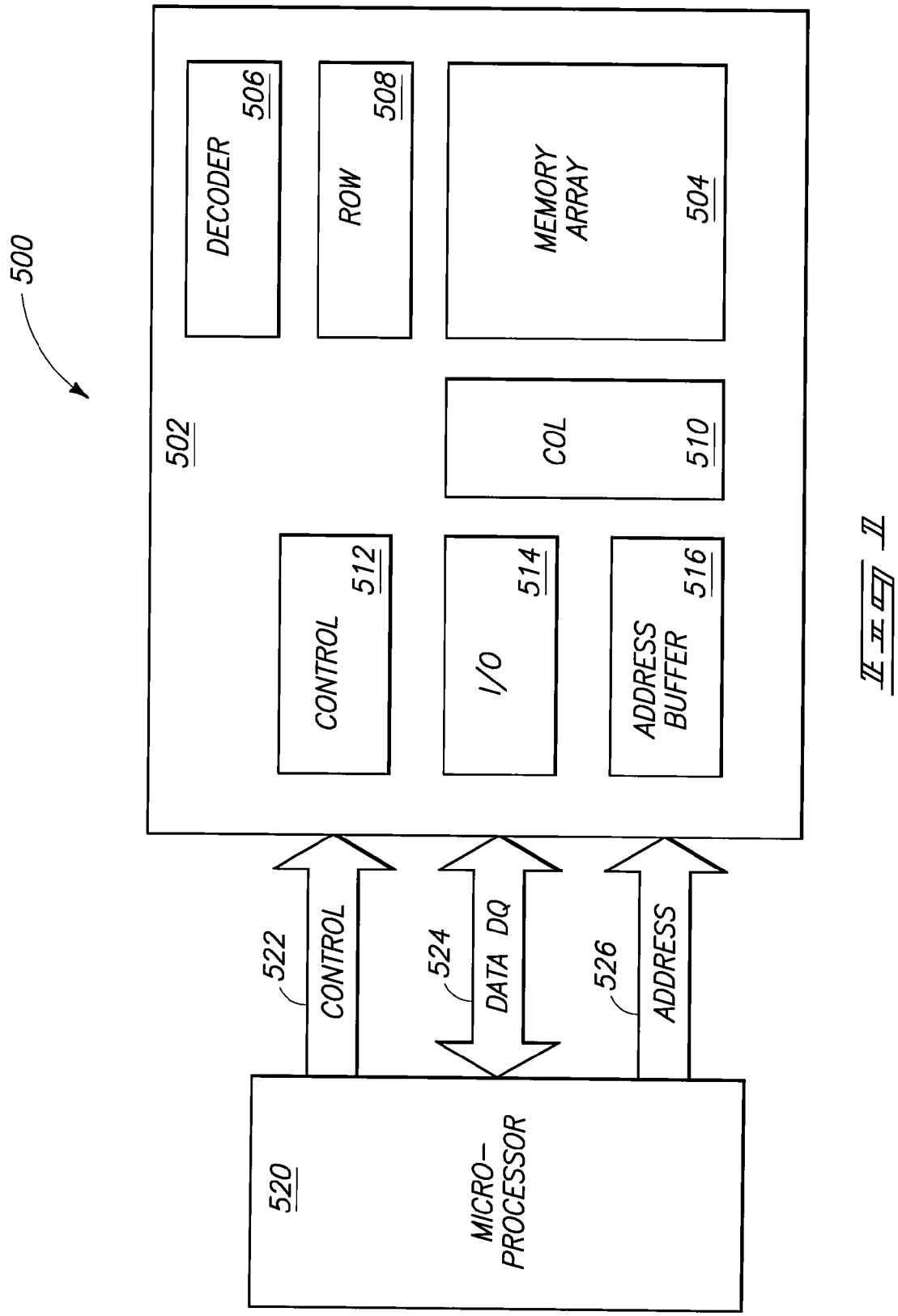
FIG. 1 is a simplified block diagram of a memory system in accordance with an embodiment.

FIG. 1 is a simplified block diagram of a memory system 500, according to an embodiment. Memory system 500 includes an integrated circuit flash memory device 502 (e.g., a NAND memory device), that includes an array of memory cells 504, an address decoder 506, row access circuitry 508, column access circuitry 510, control circuitry 512, input/ output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 2:
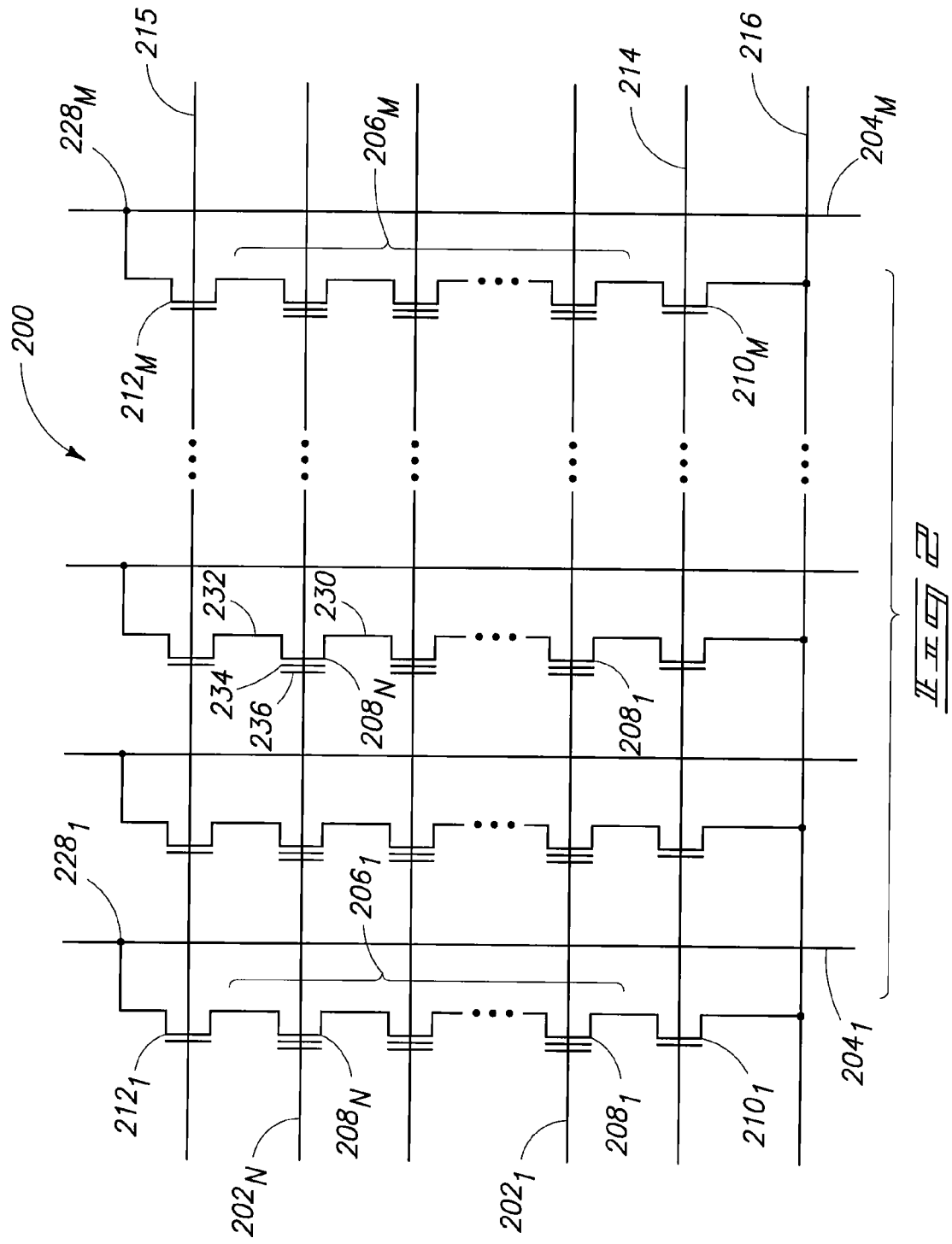
FIG. 2 is a schematic of a NAND memory array in accordance with an embodiment.

FIG. 2 is a schematic of a NAND memory array 200. Such may be a portion of memory array 504 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes charge-storing transistors $208_1$ to $208_N$. The charge-storing transistors are located at intersections of wordlines 202 and local bitlines 204. The charge-storing transistors 208 represent non-volatile memory cells for storage of data. The charge-storing transistors may comprise floating gates, or may comprise charge-trapping regions.

The charge-storing transistors 208 of each NAND string 206 are connected in series source-to-drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first charge-storing transistor 208 of the corresponding NAND string 206. For example, the drain of source select gate $210_1$ is connected to the source of charge-storing transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last charge-storing transistor 208 of the corresponding NAND string 206. For example, the source of drain select gate $212_1$ is connected to the drain of charge-storing transistor $208_N$ of the corresponding NAND string $206_1$.

Charge-storing transistors 208 include a source 230 and a drain 232, a charge-storing region 234 (which may be a floating gate or a charge-trapping region), and a control gate 236. Charge-storing transistors 208 have their control gates 236 coupled to a wordline 202. A column of the charge-storing transistors 208 are those NAND strings 206 coupled to a given local bitline 204. A row of the charge-storing transistors 208 are those transistors commonly coupled to a given wordline 202.

Figure 4:
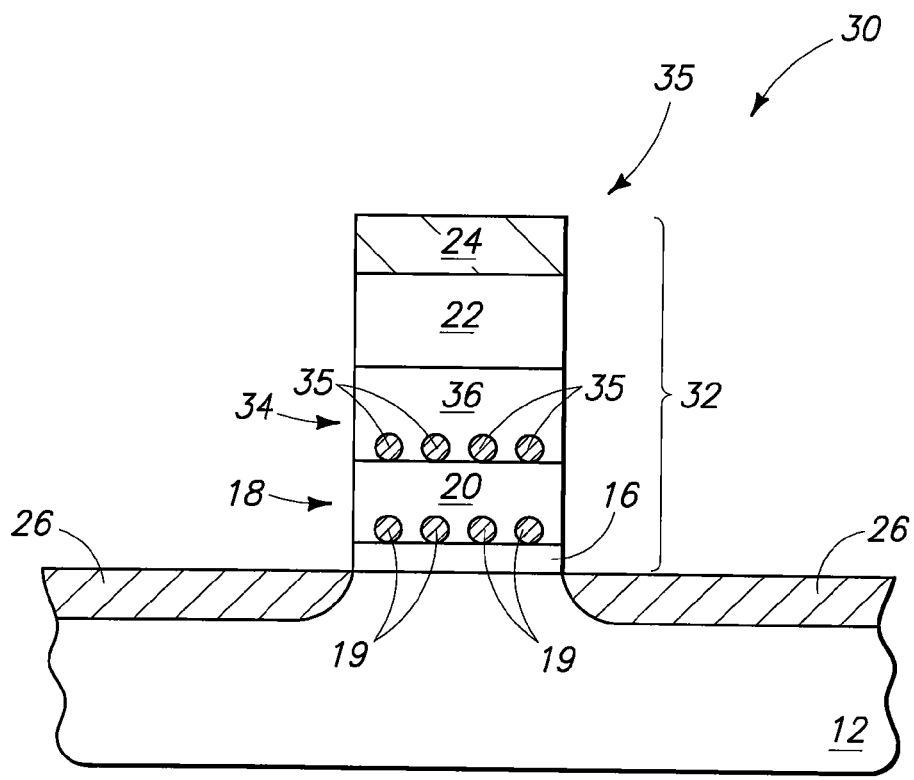
FIG. 4 is a diagrammatic cross-sectional view of a portion of a semiconductor wafer illustrating another embodiment of a memory cell.
Figure 5:
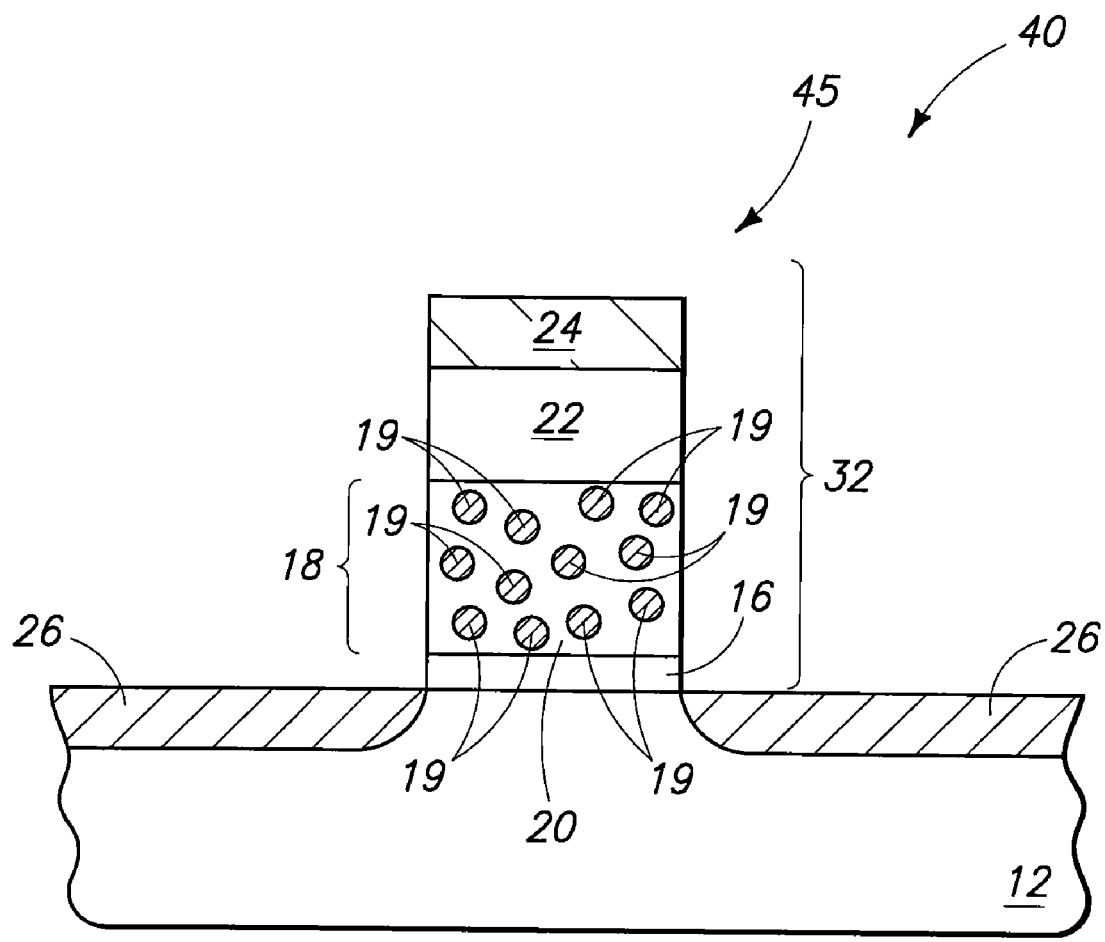
FIG. 5 is a diagrammatic cross-sectional view of a portion of a semiconductor wafer illustrating another embodiment of a memory cell.

In some embodiments, methods of forming memory cells include deposition of charge-trapping nanoclusters over a tunnel dielectric, and deposition of electrically insulative material over and between the nanoclusters. The deposition of the nanoclusters may occur in a chamber, and the deposition of the insulative material may occur in the same chamber; either sequentially to the deposition of the nanoclusters, or simultaneously with the deposition of at least some of the nanoclusters. Example memory cells that may be formed with example embodiment processes are shown in FIGS. 3-5.

Figure 3:
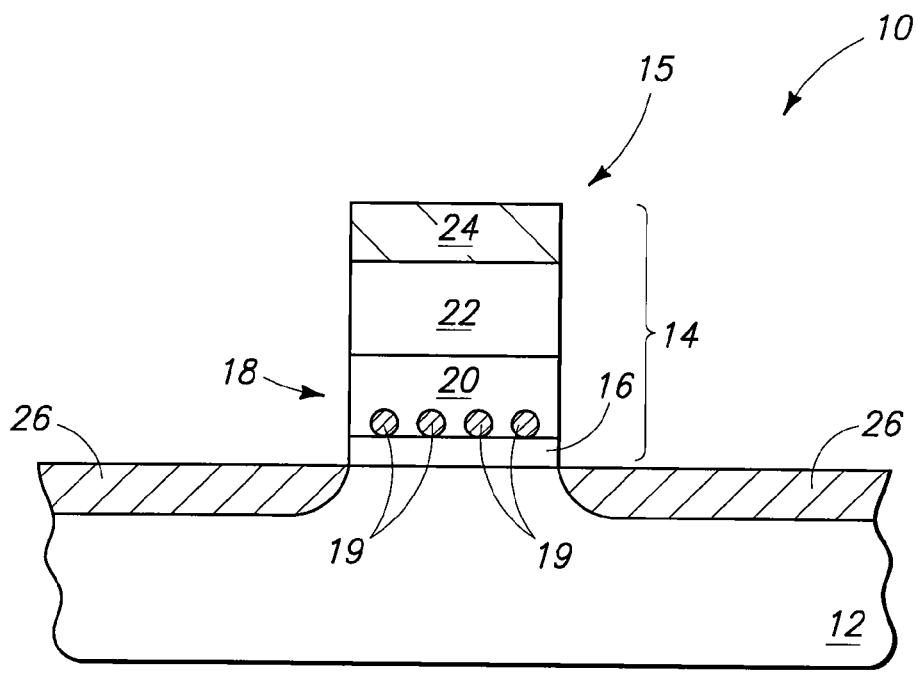
FIG. 3 is a diagrammatic cross-sectional view of a portion of a semiconductor wafer illustrating an embodiment of a memory cell.

Referring to FIG. 3, such illustrates a non-volatile memory cell 15 that is part of a semiconductor construction 10.

The semiconductor construction comprises a base 12. Base 12 may, for example, comprise, consist essentially of, or consist of monocrystalline silicon lightly-doped with background p-type dopant, and may be referred to as a semiconductor substrate, or as a portion of a semiconductor substrate. The terms "semiconductive substrate" and "semiconductor substrate" mean any construction comprising semiconductive material (for instance silicon and/or germanium), including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A gate stack 14 is supported by base 12. The gate stack includes a tunnel dielectric 16, a charge-trapping zone 18 comprising a plurality of charge-trapping centers 19, an insulative material 20 over and between the charge-trapping centers, a blocking dielectric material 22 over the insulative material 20, and a control gate material 24 over the blocking dielectric material.

The tunnel dielectric material 16 may comprise any suitable composition or combination of compositions, and may, for example, comprise, consist essentially of, or consist of one or more of silicon dioxide and various lanthanide oxides. The tunnel dielectric material may be formed to an equivalent silicon dioxide thickness of from about 1 nanometer to about 7 nanometers.

The charge-trapping centers 19 correspond to a plurality of discrete islands of charge-trapping material. The charge-trapping centers are illustrated to comprise electrically conductive material, such as metal; and in some embodiments may comprise, consist essentially of, or consist of one or more of Au, Ag, Co, Ge, Ir, Ni, Pd, Pt, Re, Ru, Si, Ta, Te, Ti and W. The charge-trapping centers may correspond to nanoclusters (specifically, clusters of nanoparticles) in some embodiments; and may have maximum cross-sectional dimensions of less than about 50 nanometers, less than about 4 nanometers, or even less than about 3 nanometers. An advantage of utilizing metal in the charge-trapping centers is that such is programmed and erased primarily with electrons; in contrast to some other materials (such as silicon nitride) which are programmed with electrons but erased with holes. The erasure with holes can damage the silicon nitride, and damage other materials through which the holes pass.

The electrically insulative material 20 may comprise any suitable composition or combination of compositions. In some embodiments, the insulative material 20 may comprise, consist essentially of, or consist of one or more of silicon dioxide, aluminum oxide and hafnium oxide.

The electrically insulative material 20 may be formed to any suitable thickness over the charge trapping centers, such as, for example, a thickness of from about 0.5 nanometers to about 30 nanometers. A combined thickness of material 20 and the charge-trapping centers within material 20 may be less than 50 Å.

The blocking dielectric material 22 may comprise any suitable composition or combination of compositions. In some embodiments, the blocking dielectric material may comprise any of various high-k dielectric compositions, including, for example, one or more of aluminum oxide, hafnium silicon oxynitride (HfSiON—which is shown in terms of constituent elements rather than stoichiometry), hafnium oxide, lanthanide silicate and lanthanide aluminate. The blocking dielectric material may have a higher dielectric constant than the tunnel dielectric material. The blocking dielectric material may be formed to an effective silicon dioxide thickness of from about 0.5 nanometers to about 10 nanometers.

The control gate material 24 may comprise any suitable composition or combination of compositions. For instance, the control gate material may comprise, consist essentially of, or consist of one or more of various metals (for instance, tungsten, titanium, etc.), metal-containing compositions (for instance, metal silicides, metal nitride, etc.) and conductively-doped semiconductor materials (for instance, conductively-doped silicon, etc.).

A pair of source/drain regions 26 are formed on opposing sides of gate stack 14. In the shown embodiment, the source/drain regions are conductively-doped regions of the semiconductor material of base 12. Source/drain regions 26 may be either n-type or p-type majority doped.

The non-volatile memory cell 15 of FIG. 3 may be utilized as an SLC device or an MLC device.

The example embodiment of FIG. 3 comprises a single layer of charge-trapping centers forming the single planar charge-trapping zone 18. Other embodiments may have more than one vertically-stacked charge-trapping zone (as shown in FIG. 4) or may have the charge trapping centers of a charge-trapping zone dispersed in a non-planar orientation (as shown in FIG. 5).

Referring to FIG. 4, such illustrates a non-volatile memory cell 35 that is part of a semiconductor construction 30. Similar number will be used to describe the construction of FIG. 4 as is used above to describe that of FIG. 3, where appropriate.

The semiconductor construction 30 comprises the base 12, and comprises a gate stack 32 supported by the base. The gate stack includes the tunnel dielectric 16, the charge-trapping zone 18 containing the charge-trapping centers 19, and the electrically insulative material 20 over and between the charge-trapping centers 19. The charge trapping zone 18 may be referred to as a first charge-trapping zone, the charge trapping centers 19 may be referred to as first charge-trapping centers, and the electrically insulative material 20 may be referred to as a first electrically insulative material.

The construction 30 includes a second charge-trapping zone 34 containing second charge-trapping centers 35, and includes a second electrically insulative material 36 over and between the second charge-trapping centers.

The construction 30 includes the blocking dielectric material 22 over the second electrically insulative material 36, and includes the control gate material 24 over the blocking dielectric material.

The shown embodiment comprises two vertically-stacked charge-trapping zones (18 and 34). Other embodiments may have more than two vertically-stacked charge-trapping zones.

Each of the shown charge-trapping zones comprises a plurality of charge-trapping centers (the charge-trapping centers are labeled 19 and 35 in zones 18 and 34, respectively). The charge-trapping centers may correspond to nanoclusters; and may comprise metal. In some embodiments, the charge-trapping centers may comprise, consist essentially of, or consist of one or more of Au, Ag, Co, Ge, Ir, Ni, Pd, Pt, Re, Ru, Si, Ta, Te, Ti and W.

The charge-trapping centers of zones 18 and 34 may be compositionally the same as one another, or may be compositionally different from one another. In some embodiments, the charge-trapping centers within one zone differ from those within another zone in one or more of size, distribution, composition, density (with density referring to a population density of the charge-trapping centers, and specifically to the number of charge-trapping centers per unit area), and trapping energy (with trapping energy referring to the potential energy depth of the traps).

In some embodiments, the differences between the charge-trapping materials within the various charge-trapping zones may, together with the differences in distances of the various zones from the tunnel dielectric, enable the zones to behave substantially differently from one another during programming of the non-volatile memory device. This may enable the different charge trapping zones to be used to create different states of an MLC device.

In other embodiments, the differences between the charge-trapping materials within the various charge-trapping zones may enable the zones to behave similarly to one another during programming of the non-volatile memory device in spite of the different distances of the zones from the tunnel dielectric 16. This may enable a larger memory window of a device to be obtained with the multiple charge-trapping zones than could be obtained with a single charge-trapping zone. Specifically, charge that is meant to be trapped, but that manages to pass through a first zone without getting trapped, may be trapped by another zone that is elevationally displaced from the first zone.

The electrically insulative material 36 may comprise any suitable composition or combination of compositions; and in some embodiments may comprise one or more of the compositions discussed in referring to the electrically insulative material 20 of FIG. 3. The materials 20 and 36 may be compositionally the same as one another in some embodiments, and may be compositionally different from one another in other embodiments.

The electrically insulative material 36 may comprise any suitable thickness over charge-trapping centers 35; such as, for example, a thickness of from about 0.5 nanometers to about 30 nanometers.

The source/drain regions 26 are formed on opposing sides of gate stack 32.

The non-volatile memory cell 35 of FIG. 4 may be utilized as an SLC device or an MLC device.

Referring to FIG. 5, such illustrates a non-volatile memory cell 45 that is part of a semiconductor construction 40. Similar number will be used to describe the construction of FIG. 5 as is used above to describe the construction of FIG. 3, where appropriate.

The semiconductor construction 40 comprises the base 12, and comprises a gate stack 42 supported by the base. The gate stack includes the tunnel dielectric 16, the charge-trapping zone 18 containing the charge-trapping centers 19, and the electrically insulative material 20 over and between the charge-trapping centers 19. The charge-trapping zone 18 of FIG. 5 differs from that of FIG. 3 in that the charge-trapping centers are elevationally dispersed throughout insulative material 20 of FIG. 5, rather than being along a single elevational plane. The elevationally dispersed charge-trapping centers of FIG. 5 may enable a larger memory window of a device to be obtained than could be obtained with charge-trapping centers along a single elevational plane. A combined thickness of material 20 and the charge-trapping centers within material 20 may be from about 40 Å to about 200 Å.

The construction 40 includes the blocking dielectric material 22 over the electrically insulative material 20, and includes the control gate material 24 over the blocking dielectric material. Additionally, construction 40 includes the source/drain regions 26 on opposing sides of gate stack 42.

The non-volatile memory cell 45 of FIG. 5 may be utilized as an SLC device or an MLC device.

The memory cells of FIGS. 3-5 may be formed by example embodiment processes described with reference to FIGS. 6-19. Similar number will be used to describe the embodiments of FIGS. 6-19 as is used above to describe FIGS. 3-5, where appropriate.

Figure 6:
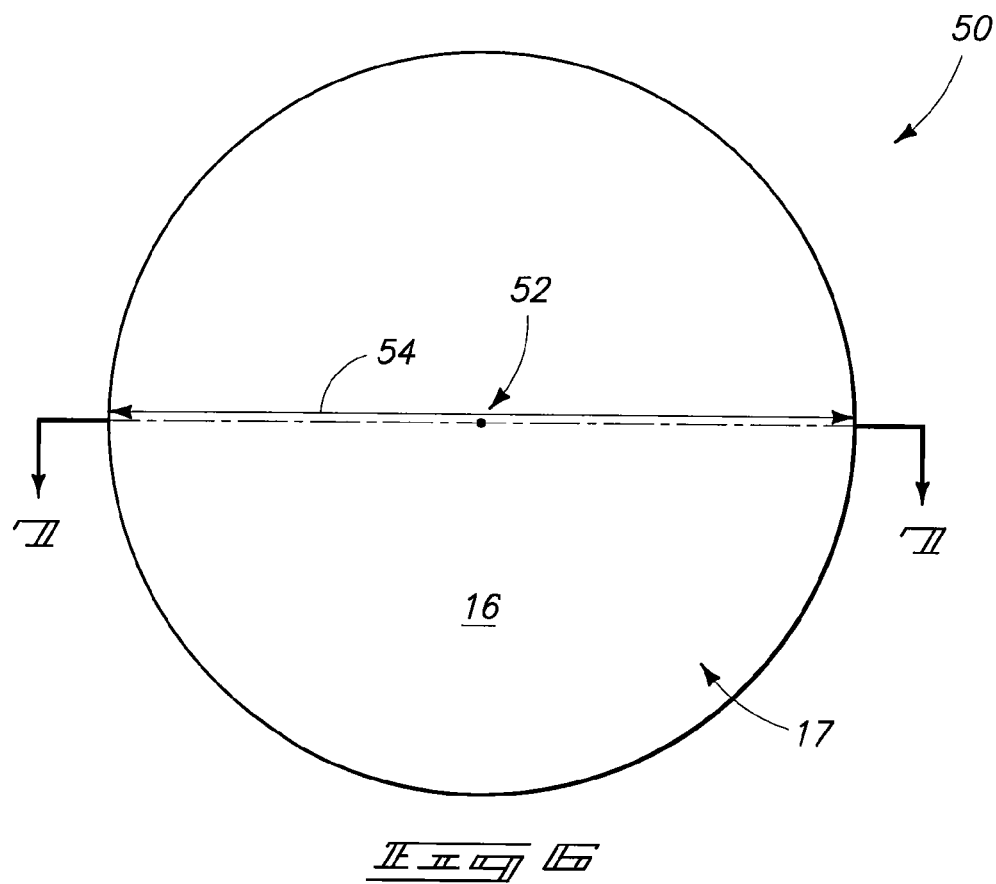
FIGS. 6 and 7 are a diagrammatic top view, and cross-sectional side view, respectively, of an example semiconductor construction that may be utilized in some embodiments. The cross-section of FIG. 7 is along the line 7-7 of FIG. 6.
Figure 7:
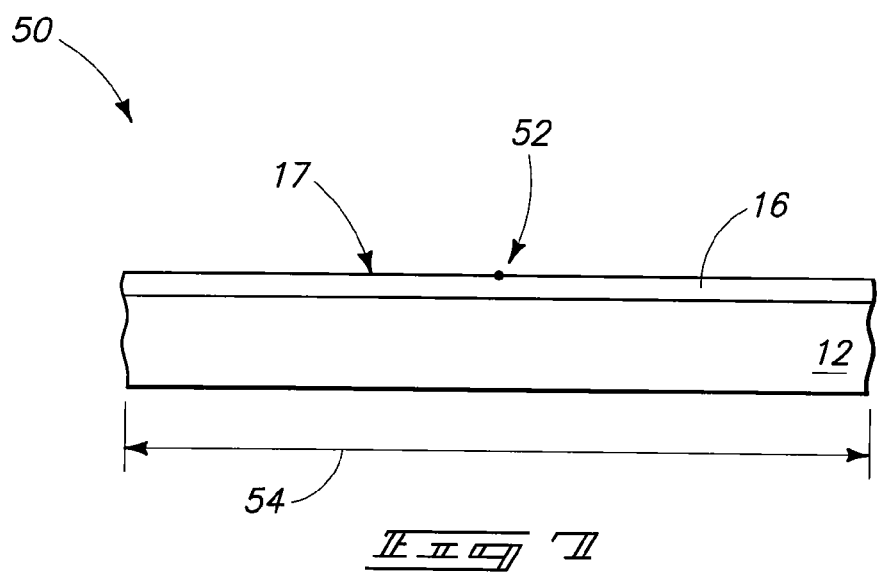
Figure 20:
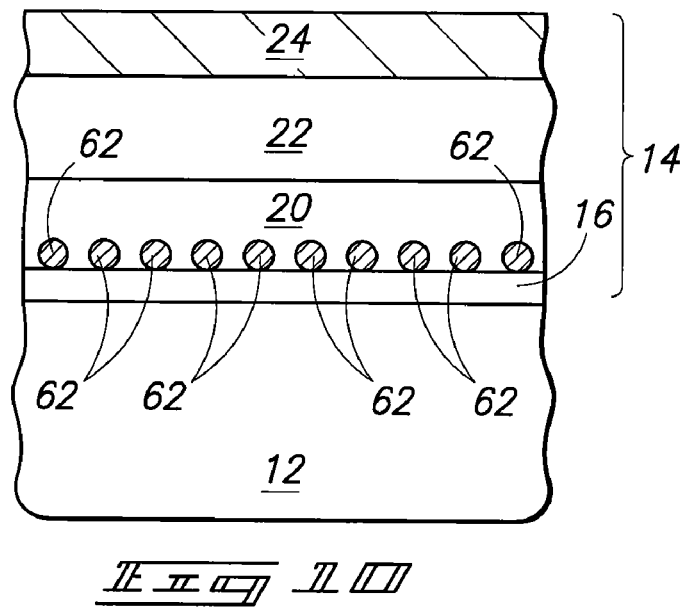
Figure 21:
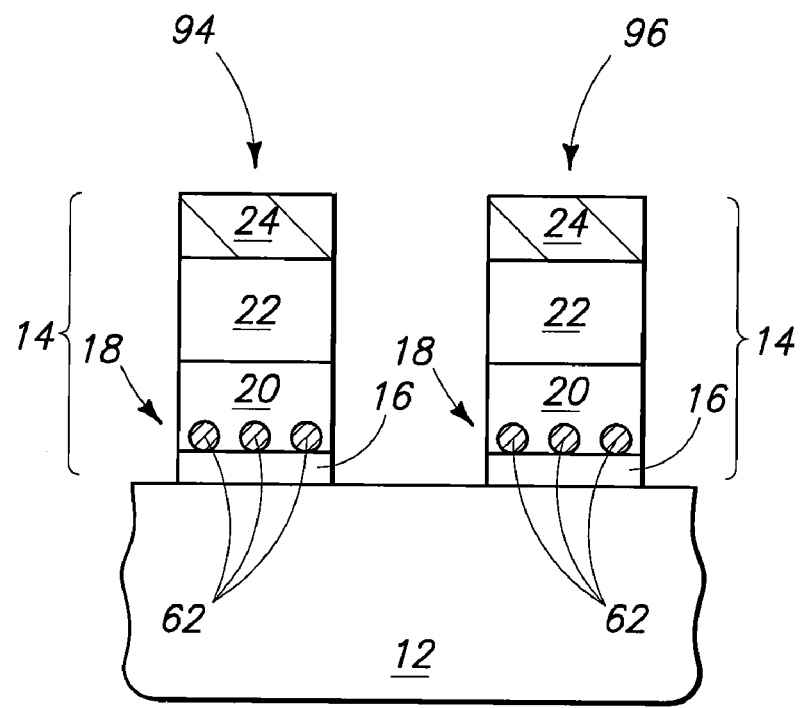

Referring to FIGS. 6 and 7, a semiconductor construction 50 is illustrated in top view and cross-sectional side view, respectively. The construction 50 includes the base 12 and tunnel dielectric material 16 that were described previously.

The construction 50 has a top surface 17 extending across the tunnel dielectric material 16. If construction 50 has an outer periphery corresponding to a polygon, circle, ellipse, etc., a central location of surface 17 may be mathematically calculated. In the shown embodiment, the construction 50 has a circular outer periphery, and a central location 52 is labeled in the center of the circle. A dimension of the surface may be defined as a distance extending from one side of the surface to another, and through the central location. In the shown embodiment, a dimension 54 is shown to correspond to a diameter of the circular construction 50.

Referring to FIG. 8, construction 50 is placed within a chamber 56. In the shown embodiment, the construction is supported by a support member 58 configured to rotate the construction about an axis 59 extending through the central location 52 of the construction. The rotation is diagrammatically illustrated with an arrow 61.

An apparatus 60 is provided proximate the chamber, and is configured for generating nanoclusters 62. The apparatus includes a first chamber 66 contained within a second chamber 68. A target 64 is provided within the first chamber, and nanoparticles are sputtered from such target. The sputtering of the nanoparticles is represented by arrows 65 within the chamber 66. The target may be at any appropriate location within chamber 66, and in some embodiments there may be multiple targets within chamber 66. The target may be of any suitable size and composition. The sputtering chamber 66 may have one or more of oxygen, argon, nitrogen and helium gas therein, or flowing therethrough. The sputtering chamber may use DC sputtering in some embodiments. A pressure within chamber 66 may be from about 0.1 milliTorr to about 30 milliTorr, and sputter power may be from about 50 watts to about 5 kilowatts.

A port is provided at an end 67 of the internal chamber 66, and the sputtered nanoparticles may exit such port to enter into the outer chamber 68. The outer chamber may be filled with a gas and/or liquid. In some applications, an outer periphery of the outer chamber may be lined with liquid nitrogen or with water (which may be in a liquid or vapor phase), which may be utilized for temperature control, and the interior of the outer chamber 68 may be filled with gas. The outer chamber 68 may be utilized for enabling aggregation of groups of nanoparticles into nanoclusters, and may have a pressure therein of from about 1 milliTorr to about 2 Torr in some embodiments. The size of the nanoclusters may be controlled by controlling, among other things, a temperature within chamber 68, a pressure within chamber 68, a duration of time that the nanoparticles are within chamber 68, and an initial size of the nanoparticles. The apparatus 60 may be considered an example of an off-axis sputtering gun.

The nanoparticles may be formed so that all of the nanoparticles have a maximum dimension of less than 10 nanometers; and in some embodiments may all have a maximum dimension of from about 1.5 to about 10 nanometers; the nanoparticles may be atoms, molecules or clusters. In some embodiments, the nanoparticles may be substantially spherical, and such embodiments the maximum dimension may correspond to a diameter through a spherical particle. Sizes and/or shapes of the nanoparticles may be controlled by controlling sputtering condition within chamber 66, such as, for example, controlling sputtering power, target composition, etc.

A desired size of the nanoclusters may vary from one application to another. In some applications, it may be desired that the nanoclusters have maximum dimensions of less than or equal to about 50 nanometers. In some applications, it may be desired that the nanoclusters have maximum dimensions of less than or equal to about four nanometers. In some applications, it may be desired that the nanoclusters have maximum dimensions of less than or equal to about three nanometers.

The outer chamber 68 may be referred to as an aggregation tube. In the shown embodiment, the nanoclusters are directed along a path 71 (represented by several arrows) that proceeds from the aggregation tube to an outlet port 72. The nanoclusters exit from the outlet port and are dispersed across the upper surface 17 of the tunnel dielectric material 16.

The path 71 is shown to proceed through a section 80 that is diagrammatically illustrated with dashed lines 81. The segment 80 may have any suitable configuration, and any suitable length. In the shown embodiment, the segment 80 directs the nanoclusters from a location outside of the chamber 56 to the outlet port 72 within the chamber 56. In other embodiments (not shown) the chambers 66 and 68 utilized for generating the nanoclusters may be within the chamber 56 so that segment 80 is entirely contained within chamber 56.

In some embodiments, the nanoclusters formed within aggregation tube 68 may have a wider variation of sizes than is desired for the nanoclusters ultimately deposited across construction 50. In such embodiments, one or more sorting mechanisms (which may alternatively be referred to as screening mechanisms or as filtering mechanisms) may be provided along segment 80. For instance, a pair of charged plates 84 are shown which may be utilized to deflect nanoclusters according to the size of the nanoclusters, so that only nanoclusters within a predetermined tolerance of a desired size reach outlet port 72.

In some embodiments, the outlet port 72 may be rastered across the upper surface of construction 50 to assist in obtaining uniform dispersion of the nanoclusters across such upper surface. Such rastering is represented by an arrow 73 in FIG. 8.

In embodiments in which construction 50 is rotated about axis 59 during the deposition of nanoclusters 62, the outlet port 72 may be rastered across only about one half of dimension 54. For instance, the outlet port may be rastered only across a shown expanse 74 that extends from one side of construction 50 to the central axis 59. If construction 50 is not rotated during the deposition of the nanoclusters, the outlet port may be rastered across an entirety of the upper surface of construction 50. Although the rastering is illustrated to comprise movement of the outlet port relative to the substrate, in other embodiments the rastering may be accomplished by moving the substrate relative to the outlet port.

In the shown embodiment, only one outlet port is utilized for dispersing nanoclusters 62 over the upper surface of construction 50. In other embodiments, there may be multiple outlet ports simultaneously utilized for dispersing the nanoclusters across the upper surface of construction 50.

A population density of the nanoclusters 62 across the upper surface 17 of construction 50 may be controlled by controlling one or more of a speed of rotation of construction 50 around axis 59, a speed of rastering of outlet port 72, and a rate at which nanoclusters 62 are ejected from the outlet port. It may be advantageous for the density of the nanoclusters across surface 17 to be controlled by other parameters than those utilized for determining the size of the nanoclusters (with the parameters utilized for determining the size of the nanoclusters having been discussed above during a discussion of the conditions within aggregation tube 68). In some embodiments, the population density may be from about $1 \times 10^{10}$ nanoclusters/cm$^3$ to about $2 \times 10^{13}$ nanoclusters/cm$^3$; and may be, for example, from about $4 \times 10^{12}$ nanoclusters/cm$^3$ to about $8 \times 10^{12}$ nanoclusters/cm$^3$.

Although the embodiment of FIG. 8 shows nanoclusters 62 being formed within the aggregation tube 68, and ultimately being deposited over the upper surface of construction 52, in other embodiments the aggregation tube may be omitted so that the sputter-formed nanoparticles are directly deposited on construction 50. Regardless of whether the sputter-formed nanoparticles are directly deposited on construction 50, or are first formed into nanoclusters prior to being deposited on construction 50, the utilization of the sputter-formed nanoparticles may be referred to as sputter-deposition of charge-trapping centers onto construction 50. In the shown embodiment, the nanoclusters 62 correspond to such charge-trapping centers; and may be considered to be analogous to the charge-trapping centers 19 discussed above with reference to FIG. 3.

One or more pumps (not shown) may be in fluid communication with the chambers 56 and 66, and with the aggregation tube 68.

Referring to FIG. 9, electrically insulative material 20 is formed over and between the nanoclusters 62. In the shown embodiment, construction 50 remains within the same chamber 56 during the deposition of the nanoclusters (discussed above with reference to FIG. 8), and during the deposition of insulative material 20. The insulative material 20 may be formed subsequently to the formation of the nanoclusters 62 in some embodiments; and in other embodiments at least some of the insulative material may be deposited simultaneously with at least some of the nanoclusters.

In the shown embodiment, construction 50 is rotated about axis 59 during the deposition of the insulative material, and the insulative material is ejected from an outlet port 86 that may or may not be rastered back and forth across construction 50 (with such rastering being represented by arrow 88). The ejected insulative material is represented by arrows 90 exiting from outlet port 86, and is shown being directed toward construction 50. If rastering is not utilized, the source for material 20 may be configured to cover an entirety of region 92 (or of region 54 in some embodiments) with material 20 without rastering.

Insulative material 20 may be formed by any suitable method; and the formation of insulative material 20 may or may not utilize a plasma within chamber 56. In some embodiments, the insulative material may be sputter-deposited from a target (not shown).

In embodiments in which at least some of the insulative material is deposited simultaneously with at least some of the nanoparticles 62, the outlet port 86 may be rastered across only about one half of dimension 54; and specifically across a half of dimension 54 that is not covered by the rastering of the outlet port 72 (FIG. 8) utilized for the deposition of nanoclusters 62. For instance, the outlet port 86 may be rastered only across a shown expanse 92 that extends from one side of construction 50 to the central axis 59; and that corresponds to a half of dimension 54 not covered by the expanse 74 that the outlet port 72 (FIG. 8) is rastered across. If construction 50 is not rotated during the deposition of the insulative material, the outlet port 86 may be rastered across an entirety of the upper surface of construction 50. Although the rastering is illustrated to comprise movement of the outlet port relative to the substrate, in other embodiments the rastering may be accomplished by moving the substrate relative to the outlet port. Although the expanses 74 and 92 are each shown to be one-half of dimension 54, in practice it may be difficult to raster the outlet ports 72 (FIG. 8) and 86 (FIG. 9) across exactly one-half of dimension 54. Instead, the outlet ports 72 and 86 will be each rastered across about one-half of dimension 54, with the term "about" indicating that there will be some tolerances in the process due to practical limitations.

In the shown embodiment, only one outlet port is utilized for dispersing insulative material 20 over the upper surface of construction 50. In other embodiments, there may be multiple outlet ports simultaneously utilized for dispersing the insulative material across the upper surface of construction 50. In some embodiments, the insulative material may be formed by chemical vapor deposition or atomic layer deposition, and may be deposited without utilization of an outlet port. The material 20 may be formed to a thickness of from about 10 Å to about 100 Å in some embodiments, with a thickness of material 20 being chosen, in part, to address leakage issues.

A bias power may be applied to construction 50 during the deposition of nanoclusters 62 (FIG. 8) and/or during deposition of insulative material 20 (FIG. 9). Such bias power may be less than or equal to about 1500 watts, and, in some embodiments, may be utilized in conjunction with an alternating electromagnetic field generated with alternating voltages of from about 100 volts to about 2 kilovolts.

Referring to FIG. 10, blocking dielectric material 22 and control gate material 24 may be formed over the electrically insulative material 20 to create the gate stack 14 discussed above with reference to FIG. 3 (with nanoclusters 62 corresponding to the charge-trapping centers 19 discussed above with reference to FIG. 3). In some embodiments, one or both of the blocking dielectric material 22 and the control gate material 24 may be formed in the same chamber 56 as is utilized in FIGS. 8 and 9 during deposition of the nanoclusters 62 and the insulative material 20. In some embodiments, one or both of the blocking dielectric material and the control gate material may be formed in a deposition chamber different from the chamber 56 utilized in the processing of FIGS. 8 and 9.

Referring to FIG. 11, gate stack 14 is patterned into a plurality of spaced apart gates 94 and 96. Subsequently, source/drain regions (not shown) analogous to the source/drain regions 26 of FIG. 3 may be formed in base 12 adjacent the gates 94 and 96 to incorporate the gates into memory cells analogous to the memory cell 15 of FIG. 3. Such memory cells may correspond to NAND string gates, and thus may be incorporated into a NAND memory array analogous to the memory array discussed above with reference to FIG. 2.

The processing of FIGS. 8-11 forms memory cells analogous to the memory cell 15 of FIG. 3, with the nanoclusters 62 of the memory cell gates 94 and 96 of FIG. 11 being along a single plane and thus forming charge-trapping zones 18 analogous to the zone 18 discussed above with reference to FIG. 3. In other embodiments, the processing stages of FIGS. 8 and 9 may correspond to a single iteration of a multi-iteration process utilized for forming multiple levels of charge-trapping zones. For instance, FIGS. 12 and 13 illustrate processing that may follow that of FIG. 9 in an example embodiment utilized for forming another charge-trapping zone.

Referring to FIG. 12, construction 50 is shown at a processing stage subsequent to that of FIG. 9; and specifically is shown as a layer of nanoclusters 100 is formed over insulative material 20. The nanoclusters 100 are ejected from outlet port 72, and may be formed utilizing identical processing to that discussed above with reference to FIG. 8. The chambers 66 and 68 that were described with reference to FIG. 8 for utilization in generating nanoclusters 62 may be utilized for generating the nanoclusters 100; but are not shown in FIG. 12 in order to simplify the drawing.

The nanoclusters 100 may be identical in size and composition to the nanoclusters 62 in some embodiments. In other embodiments, the nanoclusters 100 may differ in one or both of size and composition relative to the nanoclusters 62. The nanoclusters 62 may be referred to as first nanoclusters forming a first layer over tunnel dielectric 16, and the nanoclusters 100 may be referred to as second nanoclusters forming a second layer that is elevationally over the first layer.

The layer of nanoclusters 62 may be considered to correspond to a first charge-trapping zone 18 analogous to the first charge-trapping zone of FIG. 4, and the layer of nanoclusters 100 may be considered to correspond to a second charge-trapping zone 34 analogous to the second charge-trapping zone of FIG. 4.

The nanoclusters 100 may be deposited with processing identical to that discussed above with reference to FIG. 8 for deposition of nanoclusters 62. Accordingly, construction 50 may be rotated around axis 59 (as indicated by arrow 61) and/or outlet port 72 may be rastered back-and-forth across the construction 50 (as indicated by arrow 73). In some embodiments, construction 50 is rotated, and outlet port 72 is rastered only across about one half of the dimension 54 across construction 50; with such rastering occurring only across the segment 74 in the shown embodiment.

Referring to FIG. 13, electrically insulative material 36 is formed over and between nanoclusters 100. The electrically insulative material 36 may be formed with processing identical to that discussed above with reference to FIG. 9 for formation of insulative material 20. Thus, electrically insulative material 36 may be deposited from the port 86 discussed above with reference to FIG. 9. Such port may be rastered (as indicated by arrow 88), and in some embodiments may be rastered across a segment 92 of dimension 54 that corresponds to another half of dimension 54 relative to the half of the dimension corresponding to the segment 74 that the outlet 72 (FIG. 12) was rastered across during deposition of nanoclusters 100.

Figure 14:
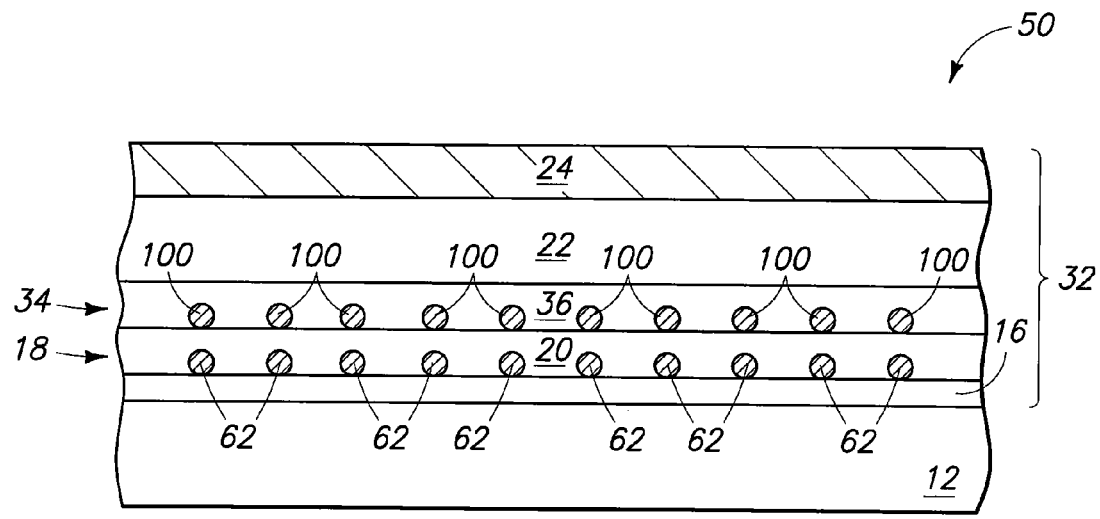
FIGS. 14 and 15 show the semiconductor construction of FIG. 13 being processed in accordance with an example embodiment.

Referring to FIG. 14, blocking dielectric material 22 and control gate material 24 may be formed over the electrically insulative material 36 to create the gate stack 32 discussed above with reference to FIG. 4 (with nanoclusters 62 and 100 corresponding to the charge-trapping centers 19 and 35, respectively, discussed above with reference to FIG. 4). One or both of the blocking dielectric material 22 and the control gate material 24 may be formed in the same chamber 56 as is utilized in FIGS. 12 and 13 during deposition of the nanoclusters 100 and the insulative material 36.

Figure 15:
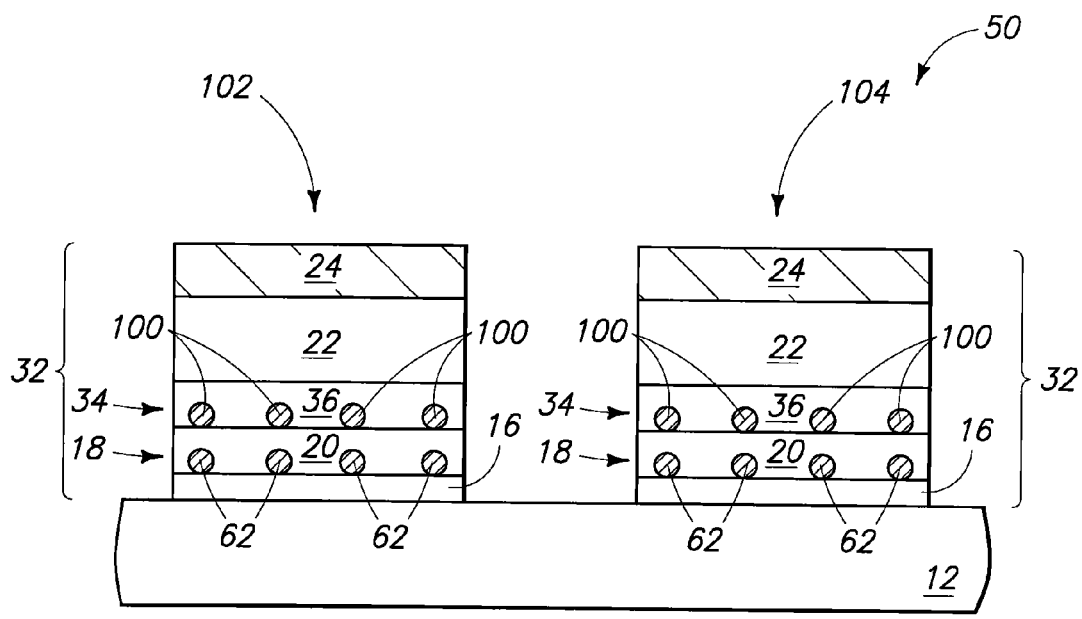

Referring to FIG. 15, gate stack 32 is patterned into a plurality of spaced apart gates 102 and 104. Subsequently, source/drain regions (not shown) analogous to the source/drain regions 26 of FIG. 4 may be formed in base 12 adjacent the gates 102 and 104 to incorporate the gates into memory cells analogous to the memory cell 35 of FIG. 4. Such memory cells may correspond to NAND string gates, and thus may be incorporated into a NAND memory array analogous to the memory array discussed above with reference to FIG. 2.

In some embodiments, electrically insulative material 20 may be referred to as a first electrically insulative material, and the electrically insulative material 36 may be referred to as a second electrically insulative material that is formed elevationally over the first electrically insulative material. The electrically insulative material 36 may be of the same composition as electrically insulative material 20 in some embodiments, and in other embodiments may be of a different composition than electrically insulative material 20.

The processing of FIGS. 8-15 forms planar charge trapping zones, analogous to the zones 18 and 34 of FIGS. 3 and 4. In other embodiments, processing similar to that described in FIGS. 8, 9, 12 and 13 may be used to form charge-trapping centers that are elevationally dispersed throughout an insulative material, rather than being along a single elevational plane. For instance, FIGS. 16-19 illustrate processing that may be used to elevationally disperse charge-trapping centers throughout an electrically insulative material.

Figure 16:
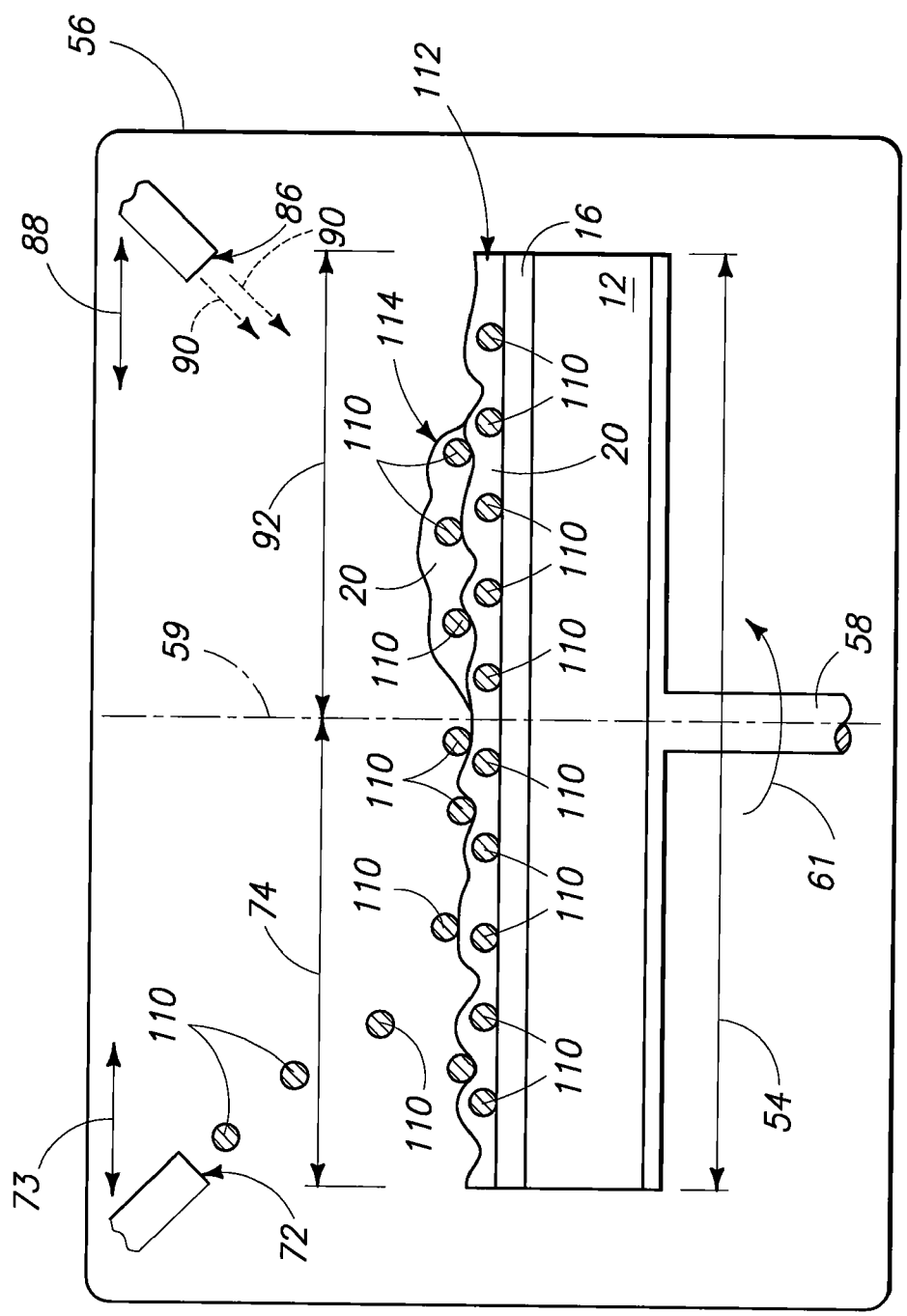
FIG. 16 shows the semiconductor construction of FIG. 7 within an example apparatus and being processed in accordance with another example embodiment.

Referring to FIG. 16, construction 50 is shown at a processing stage similar to that of FIG. 8; and specifically is shown as nanoclusters 110 are deposited over the tunnel dielectric material 16 simultaneously with the deposition of electrically insulative material 20. The nanoclusters 110 are ejected from outlet port 72, and may be formed utilizing identical processing to that discussed above with reference to FIG. 8. The chambers 66 and 68 that were described with reference to FIG. 8 for utilization in generating nanoclusters 62 may be utilized for generating the nanoclusters 110; but are not shown in FIG. 16 in order to simplify the drawing.

The nanoclusters 110 may be deposited with processing identical at discussed above with reference to FIG. 8 for deposition of nanoclusters 62. Accordingly, construction 50 may be rotated around axis 59 (as indicated by arrow 61) and/or outlet port 72 may be rastered back-and-forth across the construction 50 (as indicated by arrow 73). In some embodiments, construction 50 is rotated, and outlet port 72 is rastered only across about one half of the dimension 54 across construction 50; with such rastering occurring only across the segment 74 in the shown embodiment.

FIG. 16 differs from FIG. 9 in that electrically insulative material 20 is formed over and between nanoclusters 110 during the deposition of nanoclusters 110. The electrically insulative material 20 may be formed with processing identical to that discussed above with reference to FIG. 9. Thus, electrically insulative material 20 may be deposited from the port 86 discussed above with reference to FIG. 9. Such port may be rastered (as indicated by arrow 88), and in some embodiments may be rastered across a segment 92 of dimension 54 that corresponds to another half of dimension 54 relative to the half of the dimension corresponding to the segment 74 that the outlet 72 is rastered across.

The simultaneous deposition of both the insulative material 20 and the nanoclusters 110 causes the nanoclusters to be dispersed throughout multiple elevational layers of insulative material 20, and thus causes the nanoclusters to be dispersed both laterally and elevationally over the tunnel dielectric material 16. The insulative material 20 is shown provided in two separate layers 112 and 114. In practice, such layers would merge in a single uniform composition. However, the separate layers are shown in FIG. 16 to demonstrate that the insulative material may be considered to be provided in multiple "coats" (or layers) in some embodiments as the nozzle 86 is rastered back and forth across construction 50, and that the nanoclusters 110 may be considered to be embedded within such different coats.

Figure 17:
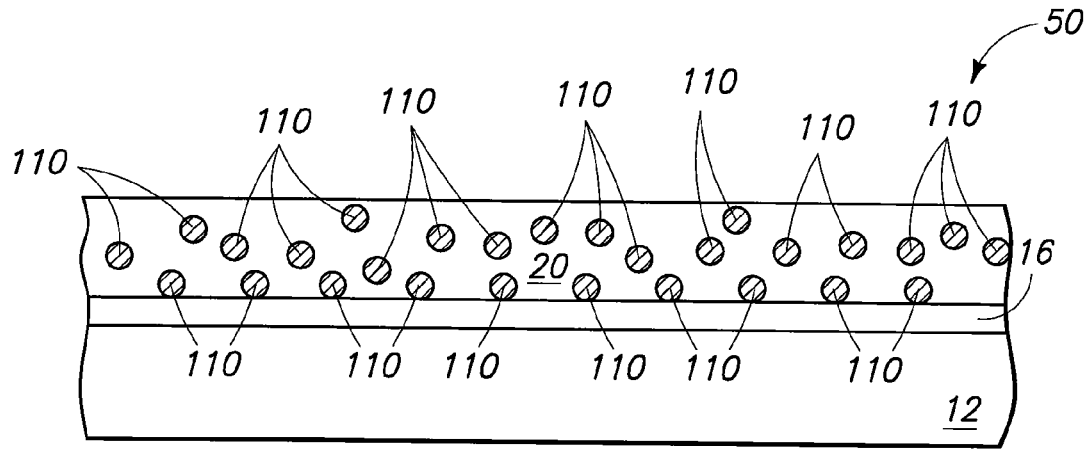
FIGS. 17-19 show the semiconductor construction of FIG. 16 being processed in accordance with an example embodiment.

In some embodiments, the deposition of nanoclusters 110 may be ceased prior to stoppage of the deposition of insulative material 20 so that there is a cap of insulative material 20 over the nanoclusters 110. FIG. 17 shows construction 50 after formation of the insulative material 20 having the nanoclusters 110 dispersed therein, and in accordance with an embodiment in which the insulative material 20 is deposited for a longer duration than the nanoclusters 110 so that all of the nanoclusters are entirely contained within the insulative material.

Figure 18:
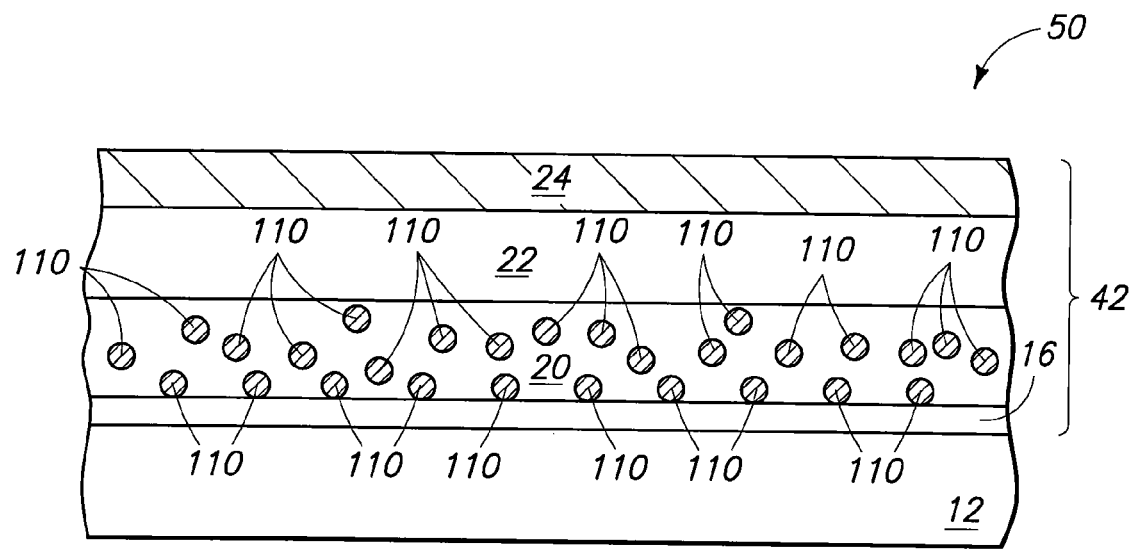

Referring to FIG. 18, blocking dielectric material 22 and control gate material 24 may be formed over the electrically insulative material 20 to create the gate stack 42 discussed above with reference to FIG. 5 (with nanoclusters 110 corresponding to the charge-trapping centers 19 discussed above with reference to FIG. 5). One or both of the blocking dielectric material 22 and the control gate material 24 may be formed in the same chamber 56 as is utilized in FIG. 16 during deposition of the nanoclusters 110 and the electrically insulative material 20.

Figure 19:
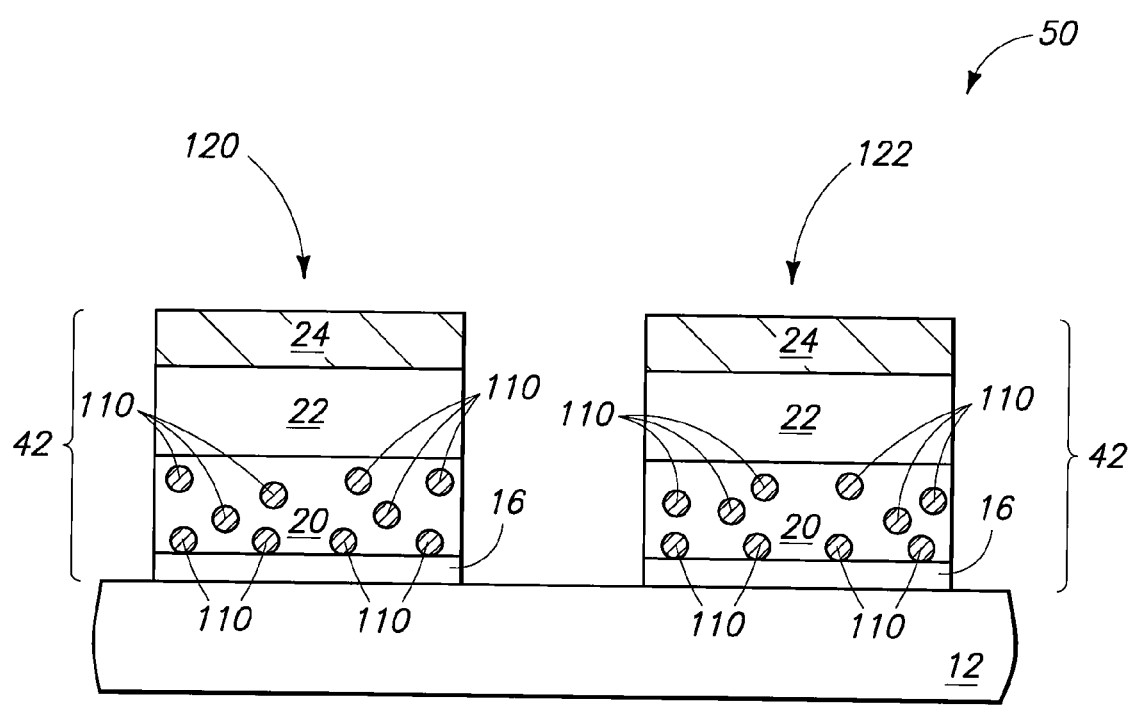

Referring to FIG. 19, gate stack 42 is patterned into a plurality of spaced apart gates 120 and 122. Subsequently, source/drain regions (not shown) analogous to the source/drain regions 26 of FIG. 5 may be formed in base 12 adjacent the gates 120 and 122 to incorporate the gates into memory cells analogous to the memory cell 45 of FIG. 5. Such memory cells may correspond to NAND string gates, and thus may be incorporated into a NAND memory array analogous to the memory array discussed above with reference to FIG. 2.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a memory cell, comprising:
   forming a semiconductor construction that includes tunnel dielectric material over a semiconductor substrate;
   while the construction is within a chamber, sputter-depositing a plurality of charge-trapping centers over the tunnel dielectric material;
   while the construction is within the chamber, forming electrically insulative material over and between the charge-trapping centers;
   forming a control gate over the electrically insulative material; and
   wherein the sputter-depositing of the charge-trapping centers comprises:
      sputtering particles of metallic material from a target and into an aggregation tube;
      aggregating groups of the particles into nanoclusters; and
      depositing the nanoclusters over the tunnel dielectric material.

2. A method of forming a memory cell, comprising:
   forming a semiconductor construction that includes tunnel dielectric material over a semiconductor substrate;
   sputtering nanoparticle material from a target, and directing the sputtered material into a chamber containing the construction to deposit the nanoparticle material as a plurality of charge-trapping centers over the tunnel dielectric material; the construction being rotated during the deposition of the sputtered material; the deposition of the sputtered material comprising ejecting the nanoparticle material from a port and toward the construction, with the port being rastered across at least a portion of the rotating construction during the deposition of the charge-trapping centers over the tunnel dielectric material;
   while the construction is within the chamber, providing electrically insulative material within the chamber to form an electrically insulative layer over and between the charge-trapping centers; and
   forming a control gate over the electrically insulative material.

3. The method of claim 2 wherein the charge-trapping centers comprise one or more metals.

4. The method of claim 2 wherein the charge-trapping centers comprise one or more of Au, Ag, Co, Ge, Ir, Ni, Pd, Pt, Re, Ru, Si Ta, Te, Ti and W.

5. A method of forming a memory cell, comprising:
   forming a semiconductor construction that includes tunnel dielectric material over a semiconductor substrate;
   sputtering nanoparticle material from a target, and directing the sputtered material into a chamber containing the construction to deposit the nanoparticle material as a plurality of charge-trapping centers over the tunnel dielectric material;
   while the construction is within the chamber, providing electrically insulative material within the chamber to form an electrically insulative layer over and between the charge-trapping centers;
   forming a control gate over the electrically insulative material;
   wherein the sputtered nanoparticle material is aggregated in an aggregation tube to form nanoclusters of the sputtered material, wherein the charge-trapping centers are the nanoclusters; and
   further comprising adjusting one or more of temperature in the tube, pressure in the tube, and duration of the nanoparticle material in the tube, to control a size of the nanoclusters so that the nanoclusters are no larger than 50 nanometers along a maximum cross-section through the nanoclusters.

6. A method of forming a memory cell, comprising:
   forming a semiconductor construction that includes tunnel dielectric material over a semiconductor substrate;
   sputtering nanoparticle material from a target, and directing the sputtered material into a chamber containing the construction to deposit the nanoparticle material as a plurality of charge-trapping centers over the tunnel dielectric material;
   while the construction is within the chamber, providing electrically insulative material within the chamber to form an electrically insulative layer over and between the charge-trapping centers;
   forming a control gate over the electrically insulative material;
   wherein the sputtered nanoparticle material is aggregated in an aggregation tube to form nanoclusters of the sputtered material, wherein the charge-trapping centers are the nanoclusters; and
   further comprising:
      adjusting one or more of temperature in the tube, pressure in the tube, and duration of the nanoparticle material in the tube to control a size of the nanoclusters so that at least some of the nanoclusters have a maximum cross-sectional dimension of less than or equal to about 50 nanometers; and
      passing the nanoclusters through one or more filtering structures between the aggregation tube and the construction so that only nanoclusters having the maximum cross-sectional dimension of less than or equal to about 50 nanometers reach the construction.

7. The method of claim 6 further comprising rotating the construction during the deposition of the nanoclusters over the tunnel dielectric material; and wherein a density of the deposited nanoclusters across the tunnel dielectric material is at least partially controlled by a speed of the rotation.

8. The method of claim 7 further comprising:
ejecting the nanoclusters from a port and toward the construction;
rastering the port across at least a portion of the rotating construction during the deposition of the nanoclusters over the tunnel dielectric material; and
wherein the density is at least partially controlled by a speed of the rastering.

9. The method of claim 8 wherein the construction is substantially circular, and wherein the port is only rastered across about one-half of a diameter of the substantially circular construction.

10. The method of claim 8 wherein the port is a first port, and wherein the electrically insulative material is ejected toward the construction from a second port; the second port also being rastered across only about one-half of a diameter of the substantially circular construction.

11. A method of forming a memory cell, comprising:
providing a semiconductor construction within a chamber, the construction including tunnel dielectric material over a semiconductor substrate; the construction having a surface, and having a central location of said surface; a dimension of the surface being defined as a distance extending from one side of the surface to another, and through the central location;
while the construction is within the chamber, dispersing charge-trapping centers over the tunnel dielectric material, the dispersing of the charge-trapping centers comprising emitting the charge-trapping centers from an outlet port, the outlet port being rastered across at least about one-half of said dimension of the surface during the dispersion of said charge-trapping centers;
while the construction is within the chamber, forming an electrically insulative layer over and between the charge-trapping centers; and
forming a control gate over the electrically insulative layer.

12. The method of claim 11 wherein the charge-trapping centers comprise material sputtered from a target.

13. The method of claim 11 wherein the charge-trapping centers comprise nanoclusters, and further comprising forming the nanoclusters by:
sputtering particles from a target, and
aggregating groups of the particles into the nanoclusters.

14. The method of claim 11 wherein the outlet port is rastered across only about one-half of said dimension of the surface during the dispersion of said charge-trapping centers, and wherein the substrate is rotated during the dispersion of said charge-trapping centers.

15. The method of claim 14 wherein:
the outlet port is a first outlet port;
the forming of the electrically insulative layer comprises emitting electrically insulative material through a second outlet port;
the second outlet port is rastered across only one-half of said dimension of the surface during the forming of said electrically insulative layer; the half of the dimension of the surface that the second outlet port is rastered across being different from the half of the dimension of the surface that the first outlet port is rastered across; and
the substrate is rotated during the forming of the electrically insulative layer.

16. The method of claim 15 wherein at least some of the electrically insulative layer is formed simultaneously with at least some of the charge-trapping centers.

* * * * *

UNITED STATES PATENT AND TRADEMARK OFFICE
CERTIFICATE OF CORRECTION

PATENT NO. : 8,093,129 B2 Page 1 of 1
APPLICATION NO. : 12/365037
DATED : January 10, 2012
INVENTOR(S) : John Mark Meldrim It is certified that error appears in the above-identified patent and that said Letters Patent is hereby corrected as shown below:

In column 14, line 15, in Claim 4, delete "Si" and insert -- Si, --, therefor.

Signed and Sealed this
Thirteenth Day of March, 2012

David J. Kappos
*Director of the United States Patent and Trademark Office*